United States Patent
He et al.

(10) Patent No.: US 11,862,278 B2
(45) Date of Patent: Jan. 2, 2024

(54) MEMORY TEST SYSTEMS AND MEMORY TEST METHODS

(71) Applicant: CHANGXIN MEMORY TECHNOLOGIES, INC., Hefei (CN)

(72) Inventors: Hao He, Hefei (CN); Dan Lu, Hefei (CN); Yang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 211 days.

(21) Appl. No.: 17/433,354

(22) PCT Filed: Mar. 12, 2021

(86) PCT No.: PCT/CN2021/080448
§ 371 (c)(1),
(2) Date: Aug. 24, 2021

(87) PCT Pub. No.: WO2021/190327
PCT Pub. Date: Sep. 30, 2021

(65) Prior Publication Data
US 2023/0055639 A1    Feb. 23, 2023

(30) Foreign Application Priority Data
Mar. 26, 2020 (CN) .......................... 202010221644.9

(51) Int. Cl.
*G11C 29/56* (2006.01)

(52) U.S. Cl.
CPC .. *G11C 29/56004* (2013.01); *G11C 29/56016* (2013.01); *G11C 2029/5602* (2013.01)

(58) Field of Classification Search
CPC ........ G11C 29/56004; G11C 29/56016; G11C 2029/5602

USPC .......................................................... 365/201
See application file for complete search history.

(56) References Cited

U.S. PATENT DOCUMENTS

| | | | |
|---|---|---|---|
| 6,324,666 B1 * | 11/2001 | Nakamoto | G11C 29/12 714/719 |
| 6,477,672 B1 | 11/2002 | Satoh | |
| 7,009,380 B2 * | 3/2006 | Chen | G06F 11/2733 714/E11.171 |

(Continued)

FOREIGN PATENT DOCUMENTS

| | | |
|---|---|---|
| CN | 106201803 A | 12/2016 |
| CN | 108107867 A | 6/2018 |

OTHER PUBLICATIONS

International Search Report cited in PCT/CN2021/080448 dated Jun. 10, 2021, 10 pages.

*Primary Examiner* — Ly D Pham
(74) *Attorney, Agent, or Firm* — Cooper Legal Group, LLC

(57) ABSTRACT

The present disclosure relates to a memory test system and a memory test method. The memory test system comprises: a plurality of test devices, a host computer, and driving modules. Each of the test devices is provided with a test interface used for connecting a memory to be tested. The host computer is respectively connected to the plurality of test devices and configured to control the test devices to test the memory to be tested. The driving modules are connected to the test devices and configured to output, to the test devices, driving signals used for driving the test devices to perform data interaction with the host computer.

14 Claims, 6 Drawing Sheets

(56) References Cited

U.S. PATENT DOCUMENTS

| | | | | |
|---|---|---|---|---|
| 7,707,473 | B2* | 4/2010 | LaBerge | G01R 31/31935 |
| | | | | 714/704 |
| 8,001,434 | B1* | 8/2011 | Lee | G11C 29/12 |
| | | | | 714/719 |
| 8,095,841 | B2* | 1/2012 | Kemmerling | G01R 31/318511 |
| | | | | 714/736 |
| 2004/0019839 | A1* | 1/2004 | Krech, Jr. | G01R 31/31705 |
| | | | | 714/724 |
| 2005/0010842 | A1* | 1/2005 | Burke, Jr. | G01R 31/31907 |
| | | | | 714/724 |
| 2008/0082889 | A1* | 4/2008 | Agata | G01R 31/31924 |
| | | | | 714/744 |
| 2011/0000829 | A1* | 1/2011 | Linde | B07C 5/344 |
| | | | | 209/571 |
| 2014/0053032 | A1* | 2/2014 | Ho | G11C 29/56016 |
| | | | | 714/718 |
| 2014/0068360 | A1 | 3/2014 | Lai et al. | |
| 2015/0038109 | A1 | 2/2015 | Salahshour | |
| 2015/0100824 | A1* | 4/2015 | Lucas | G06F 11/1402 |
| | | | | 714/22 |
| 2015/0213291 | A1* | 7/2015 | Gut | H01R 13/665 |
| | | | | 726/26 |
| 2016/0086678 | A1* | 3/2016 | Botea | G11C 7/00 |
| | | | | 365/201 |

* cited by examiner

MEMORY TEST SYSTEMS AND MEMORY TEST METHODS

CROSS-REFERENCE TO RELATED APPLICATIONS

The present disclosure claims the priority to Chinese Patent Application No. 202010221644.9, titled "Memory test systems and memory test methods", filed on Mar. 26, 2020, which is incorporated herein by reference in its entirety.

TECHNICAL FIELD

The present disclosure relates to the technical field of memories, and in particular, to a memory test system and a memory test method.

BACKGROUND

With the development and progress of technology, the application of memories in various electronic devices is increasingly wide. During the production and manufacturing of memories, in order to reduce the memory fault rate and the defective rate, it is often needed to test the memories. Therefore, there is an urgent need for memory test systems and memory test methods.

It is to be noted that the information disclosed in the background section is only provided to facilitate the understanding of the background of the present disclosure, and therefore may include information that does not constitute the existing technologies known to a person of ordinary skill in the art.

SUMMARY

The purpose of the present application is to provide a memory test system and a memory test method, which solve one or more problems caused by defects in the related art at least to some extent.

According to one aspect of the present disclosure, there is provided a memory test system, comprising:
  a plurality of test devices, each of which is provided with a test interface used for connecting a memory to be tested;
  a host computer, respectively connected to the plurality of test devices and configured to control the test devices to test the memory to be tested; and
  driving modules, connected to the test devices and configured to output, to the test devices, driving signals used for driving the test devices to perform data interaction with the host computer.

According to a second aspect of the present disclosure, there is provided a memory test method, comprising:
  transmitting a test request used for requesting connection to a host computer;
  receiving a test instruction which is a signal transmitted by the host computer according to the test request;
  determining, based on the test instruction, whether a driving module has a first preset test strategy;
  testing the memory to be tested by the first preset test strategy to obtain a first test result, when the driving module has the first preset test strategy; and
  obtaining a first initial test strategy from the host computer, and testing the memory to be tested by the first initial test strategy to obtain a first test result, when the driving module does not have the first preset test strategy.

According to a third aspect of the present disclosure, there is provided a memory test method, comprising:
  receiving a test request which is transmitted by a test device;
  transmitting a test instruction to the test device according to the test request; and
  upon receiving a test strategy request, transmitting a first initial test strategy to the test device, the first initial test strategy being used for testing the memory to be tested.

It should be understood that the aforementioned general description and following detailed description are merely exemplary and explanatory, and the present application is not limited thereto.

BRIEF DESCRIPTION OF THE DRAWINGS

The drawings herein are incorporated into the specification and constitute a part of the specification. The drawings show embodiments of the present application, and explain, together with the specification, the principle of the present application. Apparently, the drawings to be used in the following description show only some embodiments of the present application. For a person of ordinary skill in the art, other drawings may be obtained according to these drawings, without paying any creative effort.

DETAILED DESCRIPTION

Figure 1:
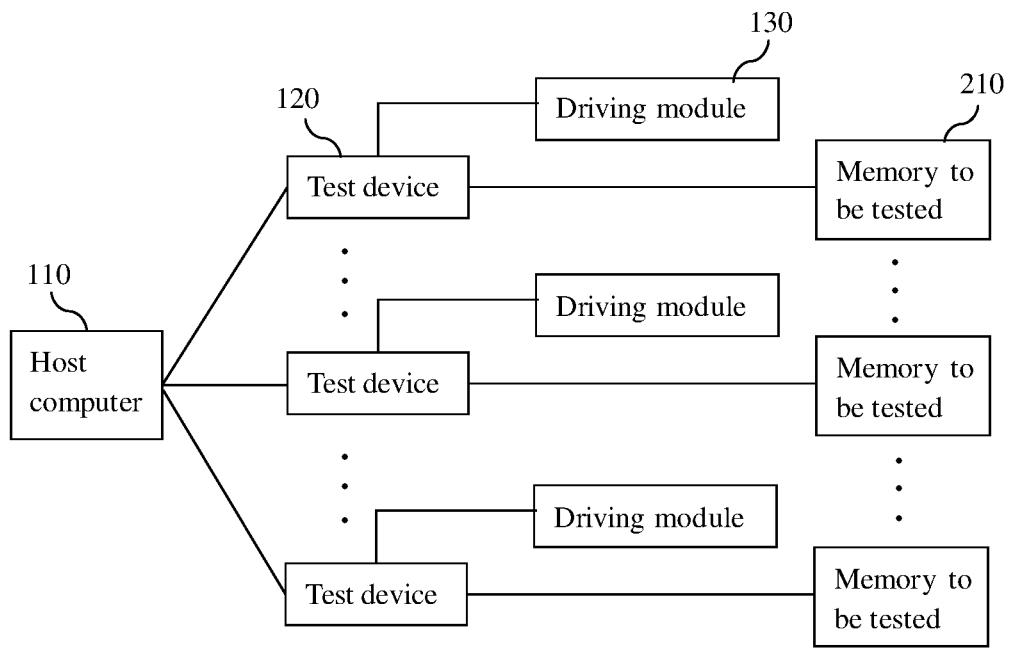
FIG. 1 is a schematic diagram of a first memory test system according to an exemplary embodiment of the present disclosure.

Exemplary implementations will now be described more fully with reference to the accompanying drawings. However, the exemplary implementations may be implemented in various forms, and should not be construed as being limited to the implementations set forth herein; instead, these implementations are provided to make the present disclosure more comprehensive and complete, and to fully convey the concepts of the exemplary implementations to those skilled in the art. The same reference numerals in the figures denote the same or similar structures, and thus the repeated description thereof will be omitted.

In addition, the described features, structures or characteristics may be combined in one or more embodiments in any suitable way. In the following description, many specific details are provided to give a sufficient understanding of the embodiments of the present disclosure. However, it will be realized by those skilled in the art that the technical solutions of the present disclosure may be practiced without one or more of the specific details, or other methods, components, materials, devices, steps, etc. may be used. In other cases, the well-known methods, devices, implementations, materials or operations will not be shown or described in detail in order to avoid obscuring aspects of the present disclosure.

The block diagrams shown in the drawings are merely functional entities, and do not necessarily correspond to physically independent entities. That is, these functional entities may be implemented in the form of software, or these functional entities or part of these functional entities may be implemented in one or more software hardened modules, or these functional entities may be implemented in different networks and/or processor devices and/or microcontroller devices.

An exemplary embodiment of the present disclosure first provides a memory test system. As shown in FIG. 1, the memory test system comprises a plurality of test devices 120, a host computer 110, and driving modules 130. Each of the test devices 120 is provided with a test interface used for connecting a memory 210 to be tested, to realize data interaction between the test device 120 and the memory 210 to be tested. The host computer 110 is respectively connected to the plurality of test devices 120 and configured to control the test devices 120 to test the memory 210 to be tested. The driving modules 130 are connected to the test devices 120 and configured to output, to the test devices 120, driving signals used for driving the test devices 120 to perform data interaction with the host computer 110.

In the memory test system in the embodiment of the present disclosure, by connecting the test devices 12 to the host computer 110 by the driving modules 130, the data interaction between the host computer 110 and the test devices 120 can be realized, and the test devices 120 can be thus controlled by the host computer 110. Moreover, by displaying the test results from the test devices 120 on the host computer 110, the memory test efficiency is improved and the memory test results can be intuitively displayed on the host computer 110.

The components of the memory test system according to the embodiment of the present disclosure will be described in detail below.

The test device 120 is provided with a test interface used for connecting the memory 210 to be tested. During the test, the memory 210 to be tested may be inserted into the test interface. Exemplarily, the test interface may be a slot formed on the test device 120. One or more test interfaces may be set on one test device 120.

The test device 120 may be a UEFI (Unified Extensible Firmware Interface)-based memory verification platform. The test device 120 may comprise a test circuit, a storage unit, an interface circuit, a housing, etc. The test circuit is connected to the interface circuit, and the test circuit is disposed inside the housing. A through hole is formed on the outer wall of the housing. The interface circuit may be disposed in the through hole. The memory 210 to be tested is connected to the interface circuit by the through hole. The memory 210 to be tested may be connected to the test device 120 by a slot connector and a patch connector.

Typically, the memory faults may comprise stuck-at faults, state transition faults, coupling faults, pattern sensitive faults, addressing faults, read and write amplification faults, and storage array faults.

The test circuit in the embodiment of the present disclosure may be used to detect the above faults. Correspondingly, corresponding test strategies and/or test programs are stored in the test devices 120, the driving modules 130, or the host computer 110. During the test, the memory to be tested may be tested by invoking a corresponding test strategy based on the test program according to the test requirements or the actual memory faults. A test strategy may be dynamically input in the host computer 110 to implement the real-time and dynamic testing of the memory.

Exemplarily, the test method may be selected according to the test data type and test case, for example, chessboard algorithm, 0/1 read and write test, marching algorithm, galloping algorithm, butterfly algorithm, etc. To select a test strategy, it is also needed to determine the single-core or multi-core test, the test time, the test memory interval, the number of times of turning off and on the cache of the CPU, and the number of test cycles. For example, for a memory to be tested, the above tests may be performed sequentially. Among all the test types, testing by using the butterfly algorithm goes wrong more often. In this case, the test strategy may be adjusted. The test may be performed by the test strategy using only the butterfly algorithm, and then further analysis is performed. For example, if the probability of test success is low in the case where the cache is turned on, the cache of the CPU may be turned on in real time and a further test is then performed.

The driving modules 130 are connected to the test devices 120 and configured to output, to the test devices 120, driving signals used for driving the test devices 120 to perform data interaction with the host computer 110.

Each of the test devices 120 is connected to one of the driving modules 130, or a plurality of test devices 120 may share one driving module 130, or it is not specifically limited in the embodiment of the present disclosure. That is, one test device 120 may be driven by one driving module 130, or a plurality of test devices 120 may be driven by one driving module 130.

Figure 2:
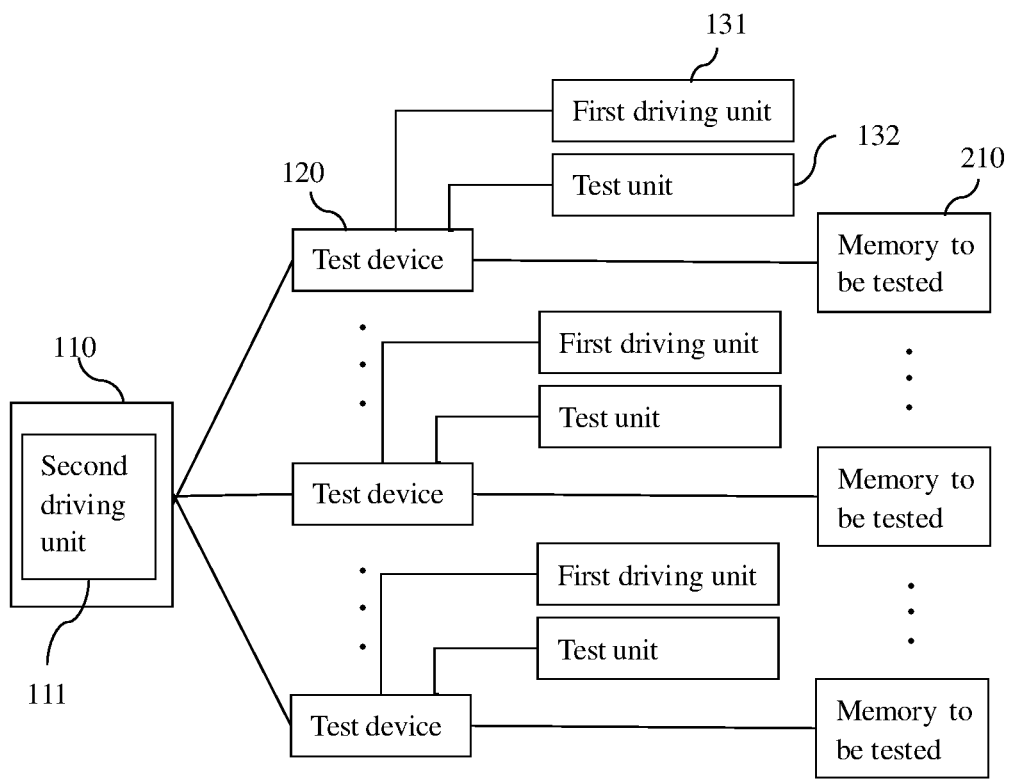
FIG. 2 is a schematic diagram of a second memory test system according to an exemplary embodiment of the present disclosure.

As shown in FIG. 2, the driving modules 130 comprises first driving units 131 and test units 132. The first driving units 131 are configured to transmit, to the test devices 120, first driving signals used for driving the test devices 120 to perform data interaction with the host computer 110. The test units 132 are configured to store test programs.

Exemplarily, the test devices 120 may be computer devices such as desktop computers or laptop computers. The driving modules 130 may be startup disks. The startup disks may be external USB flash disks or removable hard disks, and are usually in one-to-one correspondence to the test devices 120. Drive programs and test programs are stored in the startup disks. To have a test, the start disks are connected to the test devices 120, the test devices 120 are connected to the host computer 110 by loading the drive programs, and then the host computer 110 controls the test devices 120 to load the test programs to test the memory to be tested.

The host computer 110 may comprise a second driving unit 111, by which the host computer is connected to the test devices 120. The second driving unit 111 is configured to transmit, in response to the first driving signals, a second driving signal to the test devices to realize the data interaction between the test devices 120 and the host computer 110.

A drive program is disposed in the second driving unit 111 of the host computer 110. The drive program drives the connection of the host computer 110 with the test devices 120. The host computer 110 may further comprise, but not limited to, at least one processing unit, at least one storage unit, bus lines connecting different system components (including storage units and processing units), a display unit, and an interaction unit.

The storage unit may further comprise a program/utility facility having a set of (at least one) program modules. Such program modules include, but are not limited to, an operating system, one or more application programs, other program modules, and program data. Each of these examples or a combination thereof may comprise the implementation of a network environment.

The bus line may be one or more of several types of bus structures, including storage unit bus lines or storage unit controllers, peripheral bus lines, accelerated graphics ports, processing units, or local bus lines using any of multiple bus structures.

The display unit may be configured to display the memory test result. The interaction unit may be a mouse, or a keyboard, etc., by which a test instruction may be input to the host computer 110 to control the test devices 120 to perform tests.

Figure 3:
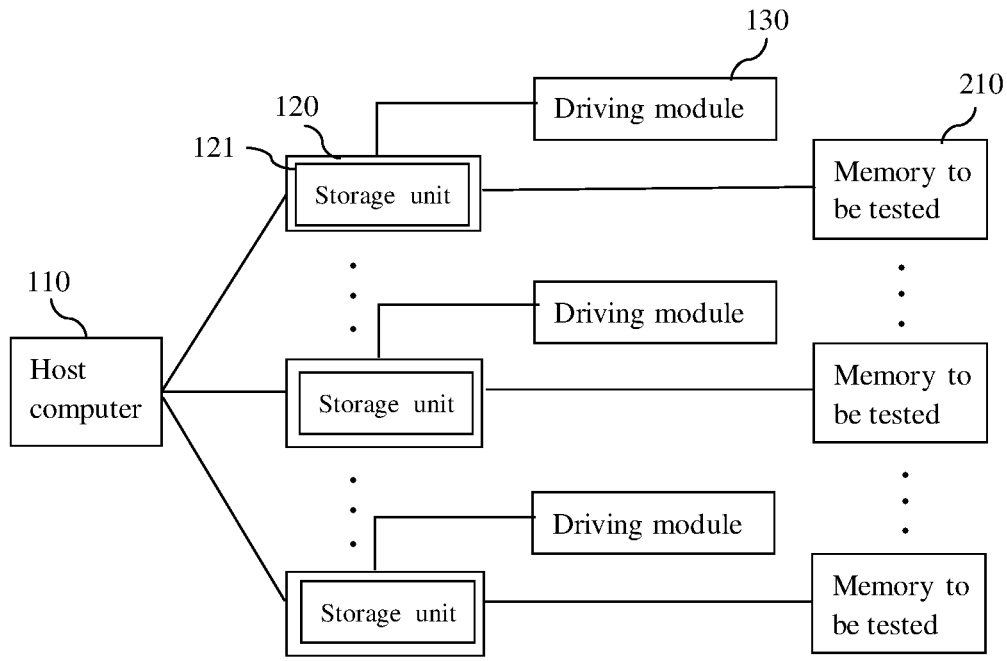
FIG. 3 is a schematic diagram of a third memory test system according to an exemplary embodiment of the present disclosure.

As shown in FIG. 3, the test devices 120 may further comprise storage units 121 configured to store the memory test results. When the test devices 120 is a desktop computer or a laptop computer, the storage unit 121 may be a hard disk of the laptop computer or the desktop computer, or a removable hard disk connected to the desktop computer or the laptop computer.

The test device 120 is a UEFI-based memory verification platform, and the UEFI is an alternative of the traditional BIOS. The test device 120 may further comprise, but is not limited to, one or more of at least one processing unit, at least one storage unit, bus lines for connecting different system components (including storage units and processing units), a display unit, and an interaction unit.

On this basis, the motherboard of the test device 120 supports the UEFI startup, and the UEFI is established on the framework called platform initialization (PI) standard. The PI standard provides standard processes and architectures for the hardware initialization in the earlier stage.

The storage unit 121 may comprise readable media in the form of volatile storage units, for example random access storage unit (RAM) and/or caches, and may further comprise read-only storage unit (ROM). The storage unit 121 may store a test program that may be executed by the processing unit of the test device 120 such that the processing unit performs steps of various types of memory tests.

The host computer 110 may also communicate with one or more external devices (e.g., test devices 120, etc.), and/or with any devices (for example routers, modems, etc.) by which the host computer 110 can communicate with one or more other computing devices. Such communication may be performed through an input/output (I/O) interface. Moreover, the host computer 110 may communicate with one or more networks (for example, local area network (LAN), wide area network (WAN), and/or public networks such as Internet) through a network adapter, to implement the connection to the test devices 120.

The host computer 110 and the test devices 120 are connected by wired connection or wireless connection. For example, the host computer 110 may be connected to the test devices 120 through media such as networks, serial ports and USBs. The host computer 110 can accurately control the data input to each test device for a test, and view the data and result output from each test device for the test.

It should be noted that, although several modules or units of the memory test system are mentioned in the above detailed description, this division is not mandatory. In fact, according to the implementations of the present disclosure, the features and functions of two or more modules or units described above may be embodied in one module or unit. Conversely, the features and functions of a module or unit described above may be further divided into multiple modules or units. In the memory test system in the embodiment of the present disclosure, by connecting the test devices 12 to the host computer 110 by the driving modules 130, the data interaction between the host computer 110 and the test devices 120 can be realized, and the test devices 120 can be thus controlled by the host computer 110. Moreover, by displaying the test results from the test devices 120 on the host computer 110, the memory test efficiency is improved and the memory test results can be intuitively displayed on the host computer 110.

Figure 4:
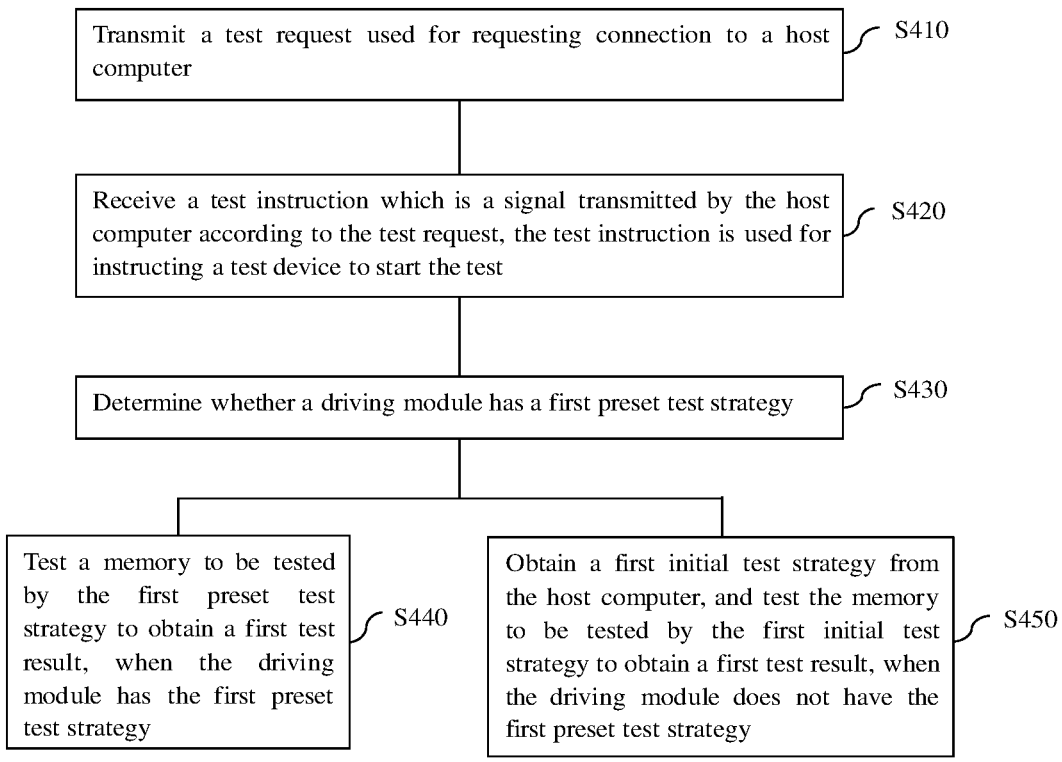
FIG. 4 is a flowchart of a first memory test method according to an exemplary embodiment of the present disclosure.

An exemplary embodiment of the present disclosure further provides a memory test method, which is provided for the test device in the memory test system described above. As shown in FIG. 4, the memory test method comprises the following steps:

S410: transmitting a test request used for requesting connection to a host computer;

S420: receiving a test instruction which is a signal transmitted by the host computer according to the test request, the test instruction being used for instructing the test devices to start the test;

S430: determining, based on the test instruction, whether a driving module has a first preset test strategy;

S440: testing the memory to be tested by the first preset test strategy to obtain a first test result, when the driving module has the first preset test strategy; and S450: obtaining a first initial test strategy from the host computer, and testing the memory to be tested by the first initial test strategy to obtain a first test result, when the driving module does not have the first preset test strategy.

In the memory test method according to the embodiment of the present disclosure, a test request used for requesting connection to the host computer is transmitted to the host computer; a test instruction returned by the host computer is received, which is a signal transmitted by the host computer according to the test request, the test instruction being used for instructing the test devices to start the test; the memory to be tested is tested by the first preset test strategy to obtain a first test result, when the driving module has the first preset test strategy; and, a first initial test strategy is obtained from the host computer, and the memory to be tested is tested by the first initial test strategy to obtain a first test result, when the driving module does not have the first preset test strategy. The memory test is implemented, the memory test efficiency is improved, and the memory test results may be intuitively displayed on the host computer.

Figure 5:
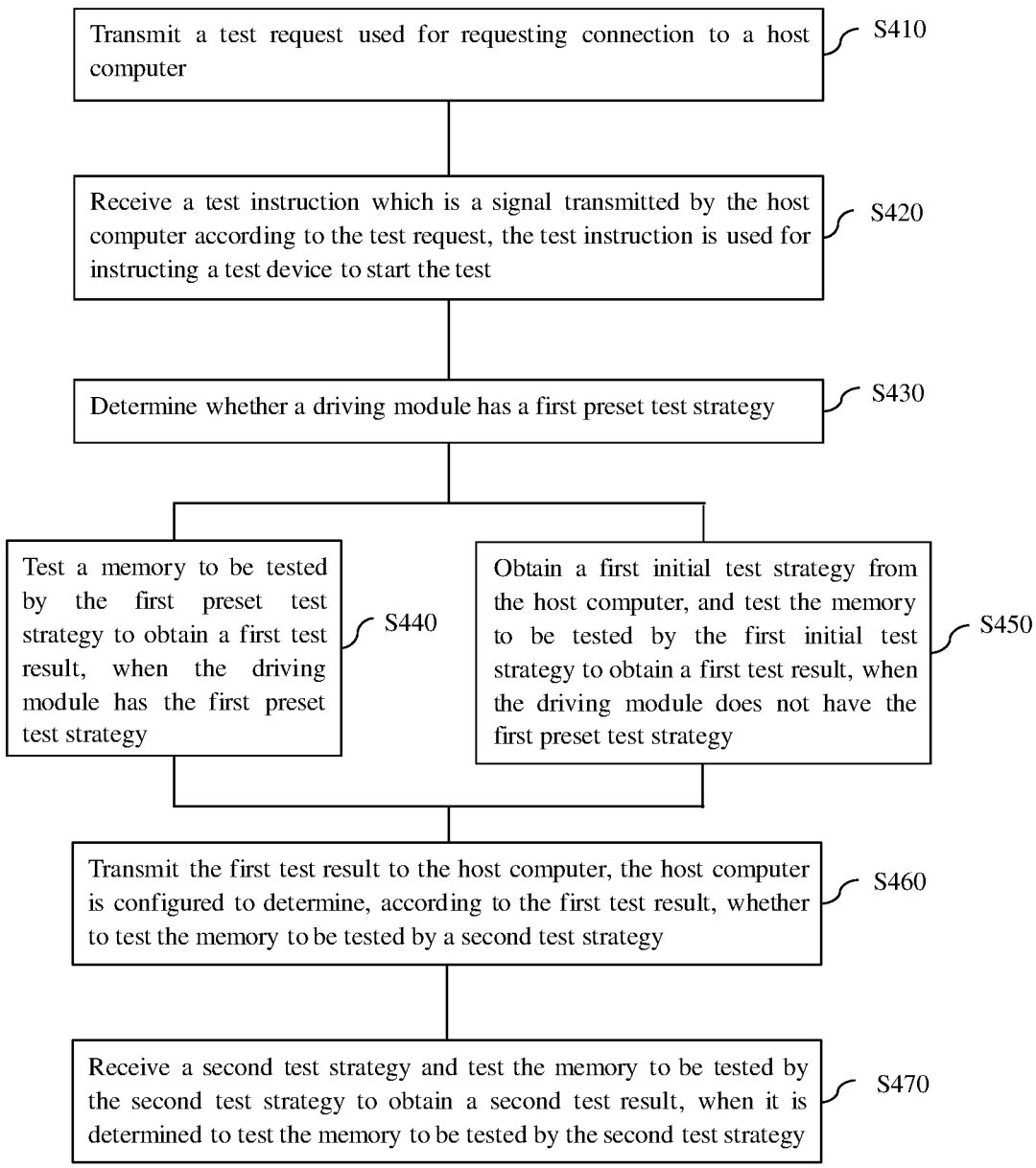
FIG. 5 is a flowchart of a second memory test method according to an exemplary embodiment of the present disclosure.

In order to further test the performance of the memory, as shown in FIG. 5, the memory test method according to the embodiment of the present disclosure may further comprise the following steps:

S460: transmitting the first test result to the host computer, the host computer being configured to determine, according to the first test result, whether to test the memory to be tested by a second test strategy; and S470: receiving the second test strategy and testing the memory to be tested by the second test strategy to obtain a second test result, when it is determined to test the memory to be tested by the second test strategy.

The first test result is transmitted to the host computer; the host computer determines, according to the first test result, whether to test the memory to be tested by a second test strategy; and, a second test strategy is received by the test devices and the memory to be tested is tested by the second test strategy, when it is determined to test the memory to be tested by the second test strategy. The performance of the memory is further tested.

Figure 6:
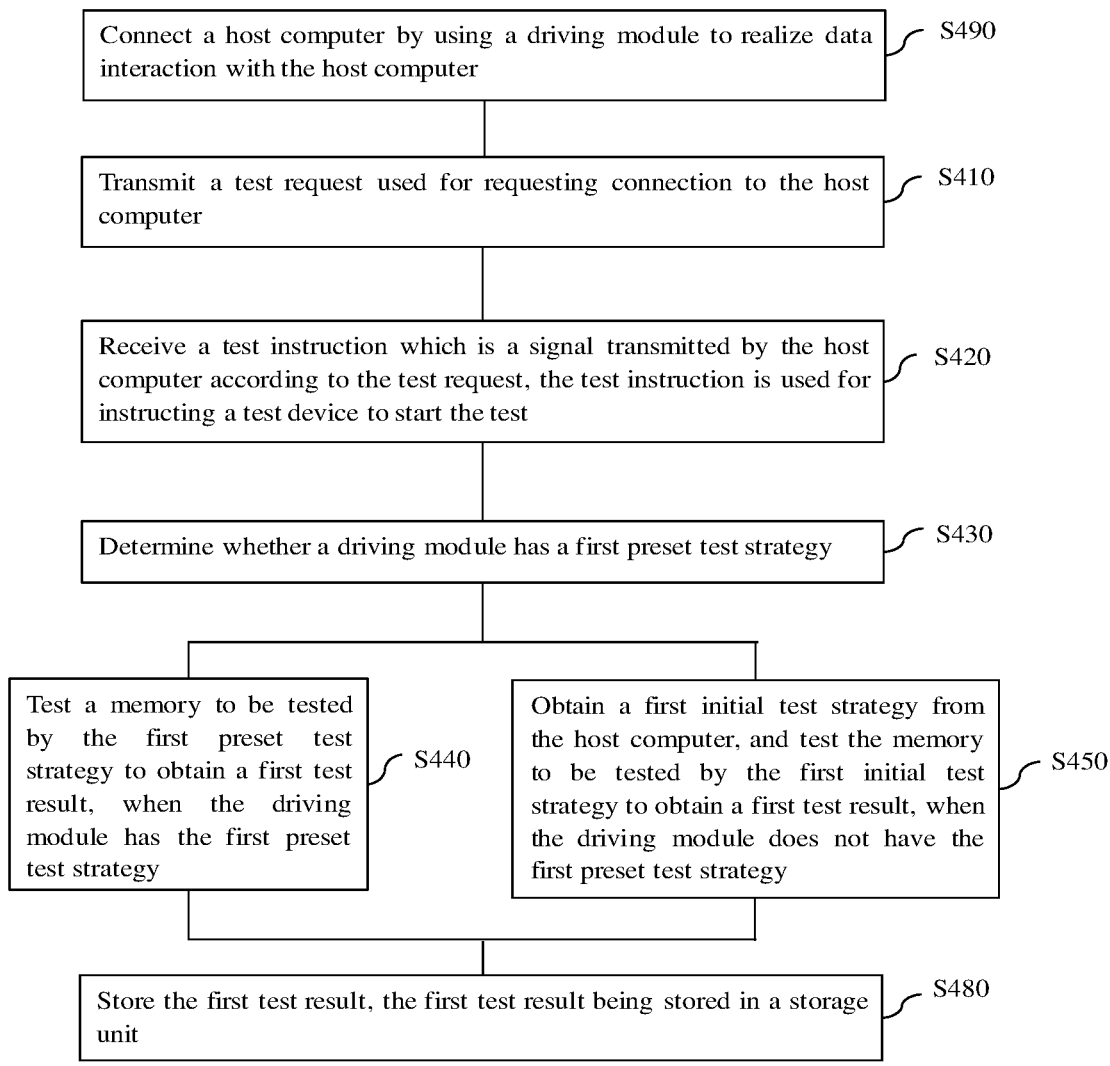
FIG. 6 is a flowchart of a third memory test method according to an exemplary embodiment of the present disclosure.

Further, as shown in FIG. 6, the memory test method according to the embodiment of the present disclosure may further comprise the following steps:

S480: storing the first test result, the first test result being stored in the storage unit of the test device; and S490: connecting the host computer by using a driving module to realize data interaction with the host computer.

In S410, a test request used for requesting connection to the host computer may be transmitted.

When it is needed to test the memory to be tested, a test device transmits a test request to the host computer, and the host computer adds the test device that transmits the test request to a test queue upon receiving the test request. When there are multiple test devices, only the test device that transmits the test request can perform data interaction with the host computer. The host computer is configured to monitor the test request from the test device in real time. After monitoring a data request, the host computer adds the test device to the test queue to have a memory test.

In S420, a test instruction is received, which is a signal transmitted by the host computer according to the test request, the test instruction being used for instructing the test devices to start the test.

Upon receiving a test request, the host computer transmits a test instruction to the test device, the test instruction being used for instructing the test device to have a memory test. Furthermore, when the test device receives the test instruction, it is indicated that the connection of the test device with the host computer is completed so that they can perform data interaction. Upon receiving the test instruction, the test device starts to test the memory to be tested.

In S430, it may be determined, based on the test instruction, whether a driving module has a first preset test strategy.

In S440, the memory to be tested is tested by the first preset test strategy to obtain a first test result, when the driving module has the first preset test strategy.

The test device invokes the first preset test strategy in the driving modules. The first preset test strategy may be any one or more memory test strategies. For example, the first preset test strategy may be any one or more of chessboard algorithm, 0/1 read and write test, marching algorithm, galloping algorithm, butterfly algorithm. It is not specifically limited in the embodiment of the present disclosure. Of course, the first preset strategy may be the test strategy specified by the user based on the test requirements.

When the test device obtains the first preset test strategy in the driving module, the test device tests the memory according to the first preset test strategy. The test device runs the first preset test strategy to obtain the first test result.

In S450, a first initial test strategy is obtained from the host computer, and the memory to be tested is tested by the first initial test strategy to obtain a first test result, when the driving module does not have the first preset test strategy.

When the test device invokes the first preset strategy from the driving module and there is no first preset test strategy in the driving module, the test device obtains a test strategy from the host computer. After obtaining a test strategy from the host computer, the test device tests the memory by the test strategy to obtain the first test result of the memory to be tested.

The first initial test strategy may be any one or more memory test strategies. For example, the first preset test strategy may be any one or more of chessboard algorithm, 0/1 read and write test, marching algorithm, galloping algorithm, butterfly algorithm. It is not specifically limited in the embodiment of the present disclosure.

In S460, the first test result is transmitted to the host computer 110, the host computer 110 being configured to determine, according to the first test result, whether to test the memory to be tested by a second test strategy.

The S460 may be performed after S450. It is necessary to subject the memory to many tests to determine whether it is qualified, and the second test is often related to the result of the first test. Exemplarily, when the first test shows that the memory is qualified, the second test may be performed; and when the first test shows that the memory is not qualified, the third test is performed to determine the specific fault. For example, first, the 0/1 read and write test is performed; when the 0/1 read and write test shows that the memory is qualified, a chessboard algorithm test is performed; when the 0/1 read and write test shows that the memory is not qualified, a galloping algorithm test is performed; and so forth.

The first preset test strategy or the first initial test strategy may mean that a plurality of tests are sequentially performed on a memory to be tested. In the first test result, it is found that more faults occur in a certain test method than in other test methods. In this case, the second test strategy may mean that the memory is tested by the method that causes more faults.

For example, among all the test types, testing by using the butterfly algorithm goes wrong more often. In this case, the test strategy may be adjusted. The test may be performed by the test strategy using only the butterfly algorithm, and then further analysis is performed. For example, if the probability of test success is low in the case where the cache is turned on, the cache of the CPU may be turned on in real time and a further test is then performed.

In S470, a second test strategy is received and the memory to be tested is tested by the second test strategy to obtain a second test result, when it is determined to test the memory to be tested by the second test strategy.

When it is determined to test the memory to be tested by the second test strategy, the host computer transmits a second test strategy to the test device according to the first test result. The test device receives the second test strategy and tests the memory by the second test strategy.

The second test strategy may be any one or more of chessboard algorithm, 0/1 read and write test, marching algorithm, galloping algorithm, butterfly algorithm. The specific second test strategy is determined according to the first test result. Of course, in practical applications, the second test strategy may be determined by empirical, and it is not limited in the embodiment of the present disclosure.

In S480, the first test result is stored, the first test result being stored in the storage unit.

Storage units are provided in the test devices. After obtaining the test result of the memory to be tested, the test device may store the test result in the storage unit. When the storage unit is the hard disk of a desktop computer or a laptop computer, the test result is stored in the hard disk.

In S490: the host computer is connected by using a driving module to realize data interaction with the host computer.

S490 may be performed before S410. The driving module outputs a driving signal to the test device. The driving signal is used for driving the electrical connection between the test device and the host computer. Each of the test devices is connected to one driving module, or a plurality of test devices may share one driving module, or it is not specifically limited in the embodiment of the present disclosure. That is, one test device may be driven by one driving module, or a plurality of test devices may be driven by one driving module.

Further, the memory test method according to the embodiment of the present disclosure further comprises: loading a test program from the driving module to test the memory to be tested by the test program.

The test program is stored in the driving module. After the data interaction is created between the test device and the host computer, the host computer may transmit a test instruction to the test device, the test instruction being used for instructing the test device to load the test program from the driving module to the local, so that the test device can run the test program based on the obtained first preset test strategy or the first initial test strategy to test the memory to be tested.

Figure 7:
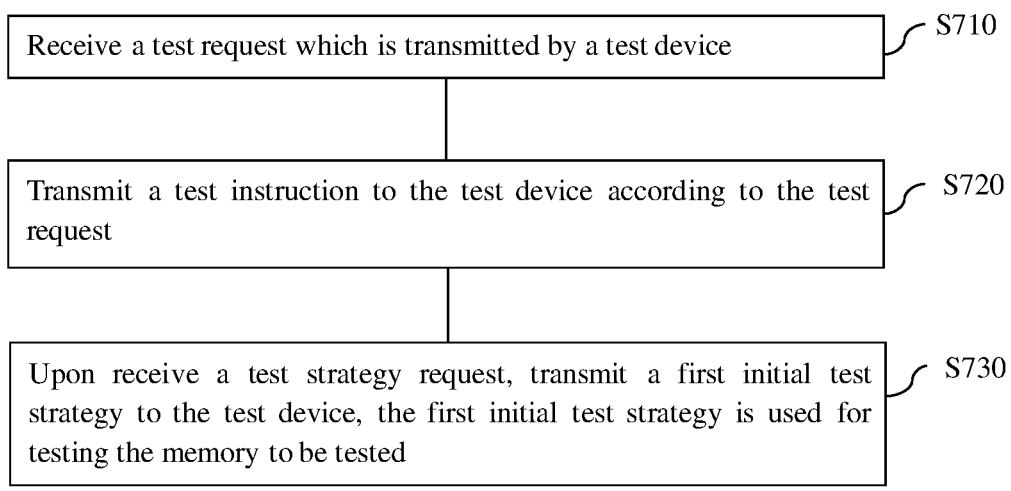
FIG. 7 is a flowchart of a fourth memory test method according to an exemplary embodiment of the present disclosure.

An exemplary embodiment of the present disclosure further provides a memory test method, which is provided for the host computer in the memory test system described above. As shown in FIG. 7, the memory test method comprises the following steps:

S710: receiving a test request which is transmitted by a test device;

S720: transmitting a test instruction to the test device according to the test request; and S730: upon receiving a test strategy request, transmitting a first initial test strategy to the test device, the first initial test strategy being used for testing the memory to be tested.

In the memory test method according to the embodiment of the present disclosure, a test request transmitted by a test device is received; the test device is connected and a test instruction is transmitted to the test device, the test instruction being used for instructing the test device to start the test; the memory to be tested is tested by a first preset test strategy to obtain a first test result, when the driving module has the first preset test strategy; and, a first initial test strategy is transmitted from the host computer, and the memory to be tested is tested by the first initial test strategy to obtain a first test result, when the driving module does not have the first preset test strategy. The memory test is implemented, the memory test efficiency is improved, and the memory test results may be intuitively displayed on the host computer.

Figure 8:
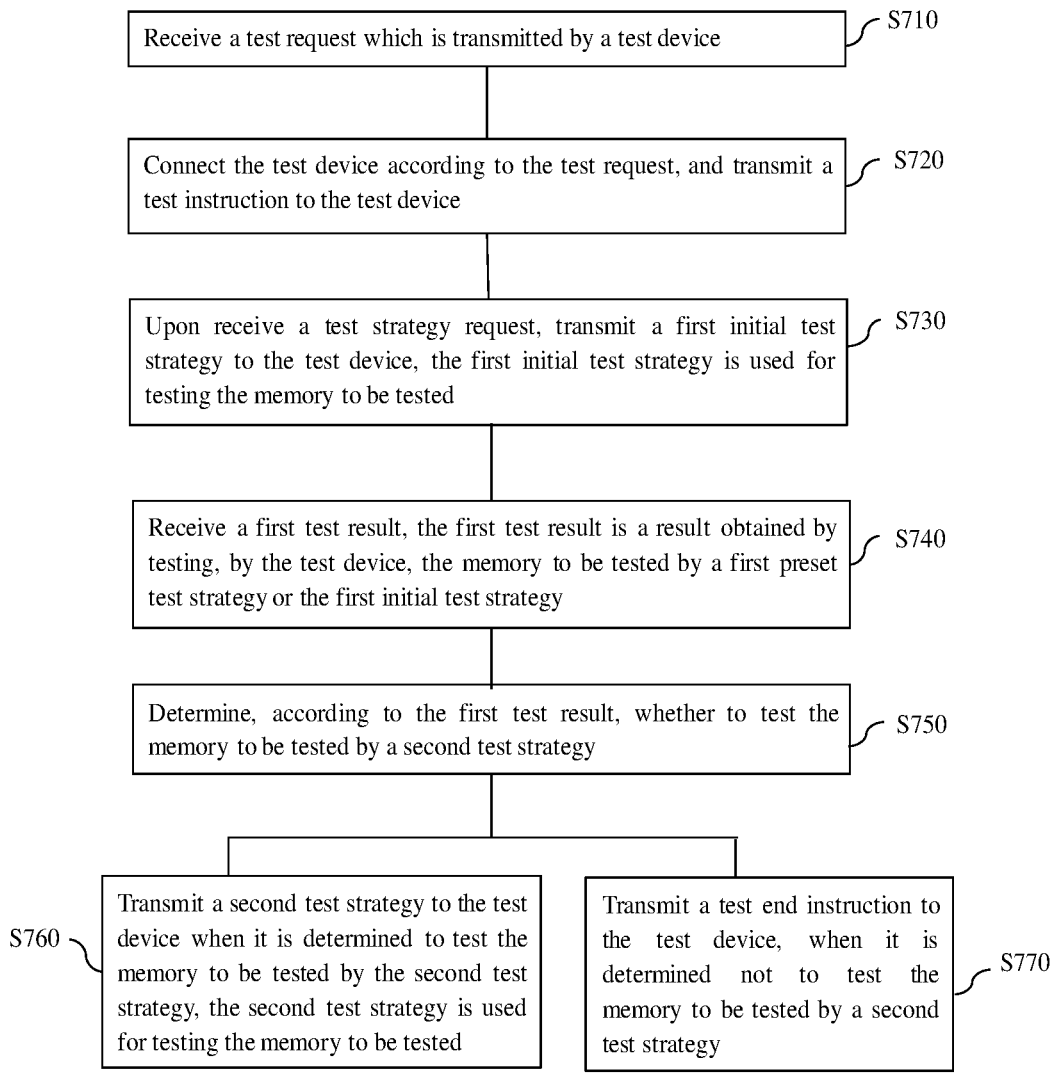
FIG. 8 is a flowchart of a fifth memory test method according to an exemplary embodiment of the present disclosure.

Further, as shown in FIG. 8, the memory test method further comprises:

S740: receiving a first test result, the first test result being a result obtained by testing, by the test device, the memory to be tested by a first preset test strategy or first initial test strategy;

S750: determining, according to the first test result, whether to test the memory to be tested by a second test strategy;

S760: transmitting the second test strategy to the test device when it is determined to test the memory to be tested by the second test strategy, the second test strategy being used for testing the memory to be tested;

S770: transmitting a test end instruction to the test device, when it is determined not to test the memory to be tested by a second test strategy.

The first test result is transmitted to the host computer; the host computer determines, according to the first test result, whether to test the memory to be tested by a second test strategy; and, a second test strategy is received by the test devices and the memory to be tested is tested by the second test strategy, when it is determined to test the memory to be tested by the second test strategy. The performance of the memory is further tested.

In S710, a test request which is transmitted by a test device may be received.

When it is needed to test the memory to be tested, a test device transmits a test request to the host computer, and the host computer adds the test device that transmits the test request to a test queue upon receiving the test request. When there are multiple test devices, only the test device that transmits the test request can perform data interaction with the host computer. The host computer is configured to monitor the test request from the test device in real time. After monitoring a data request, the host computer adds the test device to the test queue to have a memory test.

In S720, a test instruction may be transmitted to the test device according to the test request.

Upon receiving a test request, the host computer transmits a test instruction to the test device, the test instruction being used for instructing the test device to have a memory test. Furthermore, when the test device receives the test instruction, it is indicated that the connection of the test device with the host computer is completed so that they can perform data interaction. Upon receiving the test instruction, the test device starts to test the memory to be tested.

In S730, upon receiving a test strategy request, a first initial test strategy is transmitted to the test device, the first initial test strategy being used for testing the memory to be tested.

The test device may determine, based on the test instruction, whether a driving module has a first preset test strategy. The memory to be tested is tested by the first preset test strategy to obtain a first test result, when the driving module has the first preset test strategy.

The test device invokes the first preset test strategy in the driving modules. The first preset test strategy may be any one or more memory test strategies. For example, the first preset test strategy may be any one or more of chessboard algorithm, 0/1 read and write test, marching algorithm, galloping algorithm, butterfly algorithm. It is not specifically limited in the embodiment of the present disclosure. Of course, the first preset strategy may be the test strategy specified by the user based on the test requirements.

When the test device obtains the first preset test strategy in the driving module, the test device tests the memory according to the first preset test strategy. The test device runs the first preset test strategy to obtain the first test result. The test device transmits a test strategy request to the host computer, when the driving module does not have the first preset test strategy. The host computer receives the test strategy request and transmits a first initial test strategy according to the test strategy request.

The first initial test strategy may be any one or more memory test strategies. For example, the first preset test strategy may be any one or more of chessboard algorithm, 0/1 read and write test, marching algorithm, galloping algorithm, butterfly algorithm. It is not specifically limited in the embodiment of the present disclosure.

A first initial test strategy is obtained from the host computer, and the memory to be tested is tested by the initial preset test strategy to obtain a first test result, when the driving module does not have the first preset test strategy.

When the test device invokes the first preset strategy from the driving module and there is no first preset test strategy in the driving module, the test device transmits a test strategy request to the host computer, and the host computer transmits a first initial test strategy to the test device in response to the test strategy request. After obtaining the first initial test strategy from the host computer, the test device tests the memory by this test strategy to obtain the first test result of the memory to be tested.

In S740, a first test result may be received, the first test result being a result obtained by testing, by the test device, the memory to be tested by a first preset test strategy or the first initial test strategy.

When the test device obtains a first test result by the first preset first preset test strategy or the first initial test strategy, the first test result may be transmitted to the host computer. The host computer receives the first test result.

In S750, it may be determined, according to the first test result, whether to test the memory to be tested by a second test strategy.

The host computer analyzes the first test result and determines whether to adjust the test strategy according to the analysis result. It is necessary to subject the memory to many tests to determine whether it is qualified, and the second test is often related to the result of the first test. Exemplarily, when the first test shows that the memory is qualified, the second test may be executed; and when the first test shows that the memory is not qualified, the third test is executed to determine the specific fault. For example, first, the 0/1 read and write test is performed; when the 0/1 read and write test shows that the memory is qualified, a chessboard algorithm test is performed; when the 0/1 read and write test shows that the memory is not qualified, a galloping algorithm test is performed; and so forth.

In S760, a second test strategy is transmitted to the test device when it is determined to test the memory to be tested by the second test strategy, the second test strategy being used for testing the memory to be tested.

When it is determined to test the memory to be tested by the second test strategy, the host computer transmits a second test strategy to the test device according to the first test result. The test device receives the second test strategy and tests the memory by the second test strategy.

The first preset test strategy or the first initial test strategy may mean that a plurality of tests are sequentially performed on a memory to be tested. In the first test result, it is found that more faults occur in a certain test method than in other test methods. In this case, the second test strategy may mean that the memory is tested by the method that causes more faults.

For example, among all the test types, testing by using the butterfly algorithm goes wrong more often. In this case, the test strategy may be adjusted. The test may be performed by the test strategy using only the butterfly algorithm, and then further analysis is performed. For example, if the probability of test success is low in the case where the cache is turned on, the cache of the CPU may be turned on in real time and a further test is then performed.

In S770, a test end instruction may be transmitted to the test device, when it is determined not to test the memory to be tested by a second test strategy. This test end instruction is used for controlling the test device to end the test.

Figure 9:
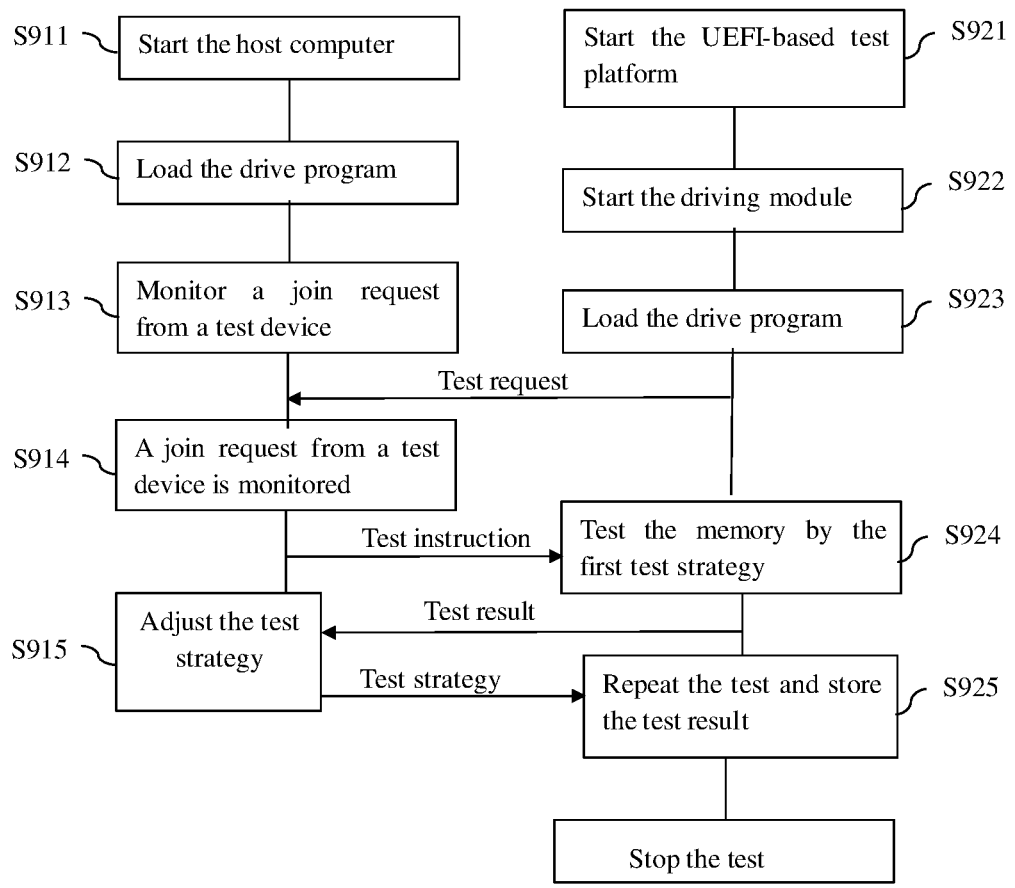
FIG. 9 is a workflow chart of a memory test system according to an exemplary embodiment of the present disclosure.

Exemplarily, the description will be given by taking the test device being a UEFI-based memory verification platform as an example. As shown in FIG. 9, together with FIG. 1, the workflow of the memory test system according to the embodiment of the present disclosure will be described below.

On the host computer 110 side, firstly, in S911, the host computer 110 is started; after the host computer 110 is started, the drive program is loaded in S912; after a drive program is loaded, a join request from a test device 120 is monitored in S913, wherein the host computer 110 monitors a join request transmitted by a test device 120 in real time; in S914, after a join request from a test device 120 is monitored, the host computer transmits a test instruction to the test device 120; and after receiving a test result transmitted by the test device 120, the test strategy is adjusted in S915, and the adjusted test strategy is transmitted to the test device 120. A new strategy may be automatically recommended for testing, based on the historically stored test results and corresponding update strategies.

On the test device 120 side, firstly, in S921, a UEFI-based test platform is started; after the test platform is started, the driving modules 130 are started in S922; then, in S923, a drive program is loaded and a test request is transmitted to the host computer 110; and after receiving a test instruction, the memory is tested by a first test strategy in S924. The UEFI-based test platform is instructed to detect whether the driving modules 130 have data of an initial test strategy. If there is an initial test strategy, the memory is tested by the initial test strategy first. If there is no initial test strategy, a new test strategy is input from the host computer 110. After receiving the adjusted test strategy, the test is repeated and the test result is stored in S925, until the test is ended. S924, S915 and S925 may be performed circularly, until the test end condition is triggered. The test result may be then used for big data analysis to determine the problems of the memory or test methods that are effective for the verification of the memory.

It should be noted that, although various steps of the method in the present disclosure have been described in the drawings, it is not required or implied that these steps must be performed in this particular order or that all the steps shown must be performed to realize the desired results. Additionally or alternatively, some steps may be omitted, multiple steps may be combined into one step, and/or one step may be decomposed into multiple steps.

Further, the drawings are merely illustrative of the processes included in the method according to the exemplary embodiment of the present disclosure, rather than for the purpose of limiting. It may be understood that the processes shown in the drawings do not indicate or limit the chronological order of these processes. In addition, it may be understood that these processes may be, for example, synchronously or asynchronously performed in multiple modules.

Those skilled in the art will readily think of other embodiments of the present disclosure by considering the specification and practicing the disclosure disclosed herein. The present application is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the claims.

It should be understood that the present disclosure is not limited to the precise structures that have been described above and shown in the drawings, and various modifications and changes may be made without departing from its scope. The scope of the present disclosure is defined only by the appended claims.

The invention claimed is:

1. A memory test system, comprising:
a plurality of test devices, each of which is provided with a test interface used for connecting a memory to be tested;
a host computer, respectively connected to the plurality of test devices and configured to control the plurality of test devices to test the memory to be tested; and
driving modules, connected to the plurality of test devices and configured to output, to the plurality of test devices, driving signals used for driving the plurality of test devices to perform data interaction with the host computer; wherein
the driving modules comprise:
first driving units, configured to transmit, to the plurality of test devices, first driving signals used for driving the plurality of test devices to perform data interaction with the host computer; and
test units, configured to store test programs; and
the host computer comprises:
a second driving unit, by which the host computer is connected to the plurality of test devices, the second driving unit being configured to transmit, in response to the first driving signals, a second driving signal to the plurality of test devices to realize the data interaction between the plurality of test devices and the host computer.

2. The memory test system according to claim 1, wherein the memory test system comprises a plurality of driving modules and each of the plurality of test devices is connected to one of the plurality of driving modules.

3. The memory test system according to claim 1, wherein the host computer and the plurality of test devices are connected by wired connection or wireless connection.

4. The memory test system according to claim 1, wherein the plurality of test devices are Unified Extensible Firmware Interface based (UEFI-based) memory verification platforms; and
the plurality of test devices further comprise:
storage units, configured to store test results of the memory to be tested.

5. A memory test method, comprising:
transmitting a test request used for requesting connection to a host computer;
receiving a test instruction which is a signal transmitted by the host computer according to the test request;
determining, based on the test instruction, whether a driving module has a first preset test strategy;
testing memory to be tested by the first preset test strategy to obtain a first test result, when the driving module has the first preset test strategy; and
obtaining a first initial test strategy from the host computer, and testing the memory to be tested by the first initial test strategy to obtain a first test result, when the driving module does not have the first preset test strategy.

6. The memory test method according to claim 5, further comprising:
transmitting the first test result to the host computer, the host computer being configured to determine, according to the first test result, whether to test the memory to be tested by a second test strategy; and
receiving the second test strategy and testing the memory to be tested by the second test strategy to obtain a second test result, when it is determined to test the memory to be tested by the second test strategy.

7. The memory test method according to claim 5, further comprising:
storing the first test result in a storage unit.

8. The memory test method according to claim 5, further comprising:
connecting the host computer by using the driving module to realize data interaction with the host computer.

9. The memory test method according to claim 8, further comprising:
loading a test program from the driving module to test the memory to be tested by the test program.

10. The memory test method according to claim 5, wherein the first preset test strategy is any one or more of chessboard algorithm, 0/1 read and write test, marching algorithm, galloping algorithm, or butterfly algorithm.

11. A memory test method, comprising:
receiving a test request which is transmitted by a test device;
transmitting a test instruction to the test device according to the test request; and
upon receiving a test strategy request, transmitting a first initial test strategy to the test device, the first initial test strategy being used for testing memory to be tested; wherein
the test strategy request is a request transmitted by the test device, when a driving module does not have a first preset test strategy.

12. The memory test method according to claim 11, further comprising:
receiving a first test result, the first test result being a result obtained by testing, by the test device, the memory to be tested by the first preset test strategy or the first initial test strategy;
determining, according to the first test result, whether to test the memory to be tested by a second test strategy; and
transmitting a second test strategy to the test device when it is determined to test the memory to be tested by the second test strategy, the second test strategy being used for testing the memory to be tested.

13. The memory test method according to claim 12, further comprising:
transmitting a test end instruction to the test device, when it is determined not to test the memory to be tested by the second test strategy.

14. The memory test method according to claim 11, wherein the first preset test strategy is any one or more of chessboard algorithm, 0/1 read and write test, marching algorithm, galloping algorithm, or butterfly algorithm.

* * * * *